(12) United States Patent
Morizuka (10) Patent No.: US 9,349,853 B2
(45) Date of Patent: May 24, 2016

(54) SEMICONDUCTOR TRANSISTOR DEVICE

(71) Applicant: Kabushiki Kaisha Toshiba, Minato-ku, Tokyo (JP)

(72) Inventor: Kohei Morizuka, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/458,645

(22) Filed: Aug. 13, 2014

(65) Prior Publication Data
US 2015/0263156 A1    Sep. 17, 2015

(30) Foreign Application Priority Data

Mar. 17, 2014    (JP) ................................. 2014-053253

(51) Int. Cl.
| H01L 21/02 | (2006.01) |
| H01L 29/78 | (2006.01) |
| H01L 29/16 | (2006.01) |
| H01L 29/10 | (2006.01) |
| H01L 29/08 | (2006.01) |

(52) U.S. Cl.
CPC .......... *H01L 29/7802* (2013.01); *H01L 29/086* (2013.01); *H01L 29/0878* (2013.01); *H01L 29/1041* (2013.01); *H01L 29/1608* (2013.01)

(58) Field of Classification Search
CPC .......................... H01L 27/11502; H01L 28/55
USPC .................................. 257/288, 295; 438/197
See application file for complete search history.

(56) References Cited

U.S. PATENT DOCUMENTS

| 8,410,489 | B2 | 4/2013 | Adachi et al. | |
| 2008/0026533 | A1* | 1/2008 | Hayashi | H01L 29/7828 438/289 |
| 2012/0057386 | A1* | 3/2012 | Adachi | H01L 29/1608 363/131 |

FOREIGN PATENT DOCUMENTS

| JP | 2006-344779 A | 12/2006 |
| JP | 2010-062332 A | 3/2010 |
| JP | 2013-055177 A | 3/2013 |

OTHER PUBLICATIONS

Qin Huang, G.A.J Amaratunga, "MOS Controlled Diodes—A new power diode", Solid-State Electronics, vol. 38, Issue 5, pp. 977-980 (May 1995).

* cited by examiner

*Primary Examiner* — Jami M Valentine
(74) *Attorney, Agent, or Firm* — White & Case LLP (57) ABSTRACT

According to one embodiment, a semiconductor device includes first electrode and second electrodes, first, second, third, fifth, and fourth semiconductor regions, a third electrode, and a second insulating film. The first semiconductor region is provided between the first and second electrodes. The second semiconductor region is provided between the first semiconductor region and the first electrode. The third semiconductor region is provided between the first semiconductor region and the second electrode. The fifth semiconductor region is provided between the first semiconductor region and the second electrode. The fourth semiconductor region is provided between the third semiconductor region and the second electrode and between the fifth semiconductor region and the second electrode. The third electrode contacts the first, third, and fourth semiconductor regions via a first insulating film. The second insulating film contacts the first, fifth, and fourth semiconductor regions.

14 Claims, 11 Drawing Sheets

FIG. 11 even dimensional characters omitted...

SEMICONDUCTOR TRANSISTOR DEVICE

CROSS-REFERENCE TO RELATED APPLICATIONS

This application is based upon and claims the benefit of priority from Japanese Patent Application No. 2014-053253, filed on Mar. 17, 2014; the entire contents of which are incorporated herein by reference.

FIELD

Embodiments described herein relate generally to a semiconductor device.

BACKGROUND

Much attention has been focused on the use of 4H-type silicon carbide (SiC) with a wide band gap as a material for semiconductor elements in place of silicon (Si). 4H-type silicon carbide has a higher breakdown voltage than silicon. As a result, a high breakdown voltage element can be formed with the use of 4H-type silicon carbide.

However, when silicon is used as a semiconductor material, the built-in potential of a p-n junction is approximately 1 V, whereas, when 4H-type silicon carbide is used as the semiconductor material, the built-in potential of a p-n junction is approximately 3 V. As a result, the on-voltage of a built-in diode is approximately 3 V in a MOSFET made with 4H-type silicon carbide. Consequently, there is an increase in the conductive loss of the built-in diode. Moreover, a pn diode composed of 4H-type silicon carbide has a property in which energy released from the recombination of carriers converts the dislocations existing inside the SiC crystal into pairs of partial dislocations and generates stacking faults. As a result, the device characteristics may deteriorate when using 4H-type silicon carbide as a semiconductor material.

DETAILED DESCRIPTION

According to one embodiment, a semiconductor device includes a first electrode, a second electrode, a first semiconductor region of a first conductivity type, a second semiconductor region of the first conductivity type, a third semiconductor region of a second conductivity type, a fifth semiconductor region of the second conductivity type, a fourth semiconductor region of the first conductivity type, a third electrode, and a second insulating film. The first semiconductor region is provided between the first electrode and the second electrode. The second semiconductor region is provided between the first semiconductor region and the first electrode, and has a higher impurity concentration than the first semiconductor region. The third semiconductor region is provided between the first semiconductor region and the second electrode. The fifth semiconductor region is provided between the first semiconductor region and the second electrode. The fourth semiconductor region is provided between the third semiconductor region and the second electrode and between the fifth semiconductor region and the second electrode, and has a higher impurity concentration than the first semiconductor region. The third electrode is in contact with the first semiconductor region, the third semiconductor region, and the fourth semiconductor region via a first insulating film. The second insulating film is in contact with the first semiconductor region, the fifth semiconductor region, and the fourth semiconductor region.

Various embodiments will be described hereinafter with reference to the accompanying drawings. In the following description, the same reference numeral is applied to the same member, and for members that have been described once, the description is omitted as appropriate.

First Embodiment

Figure 1:
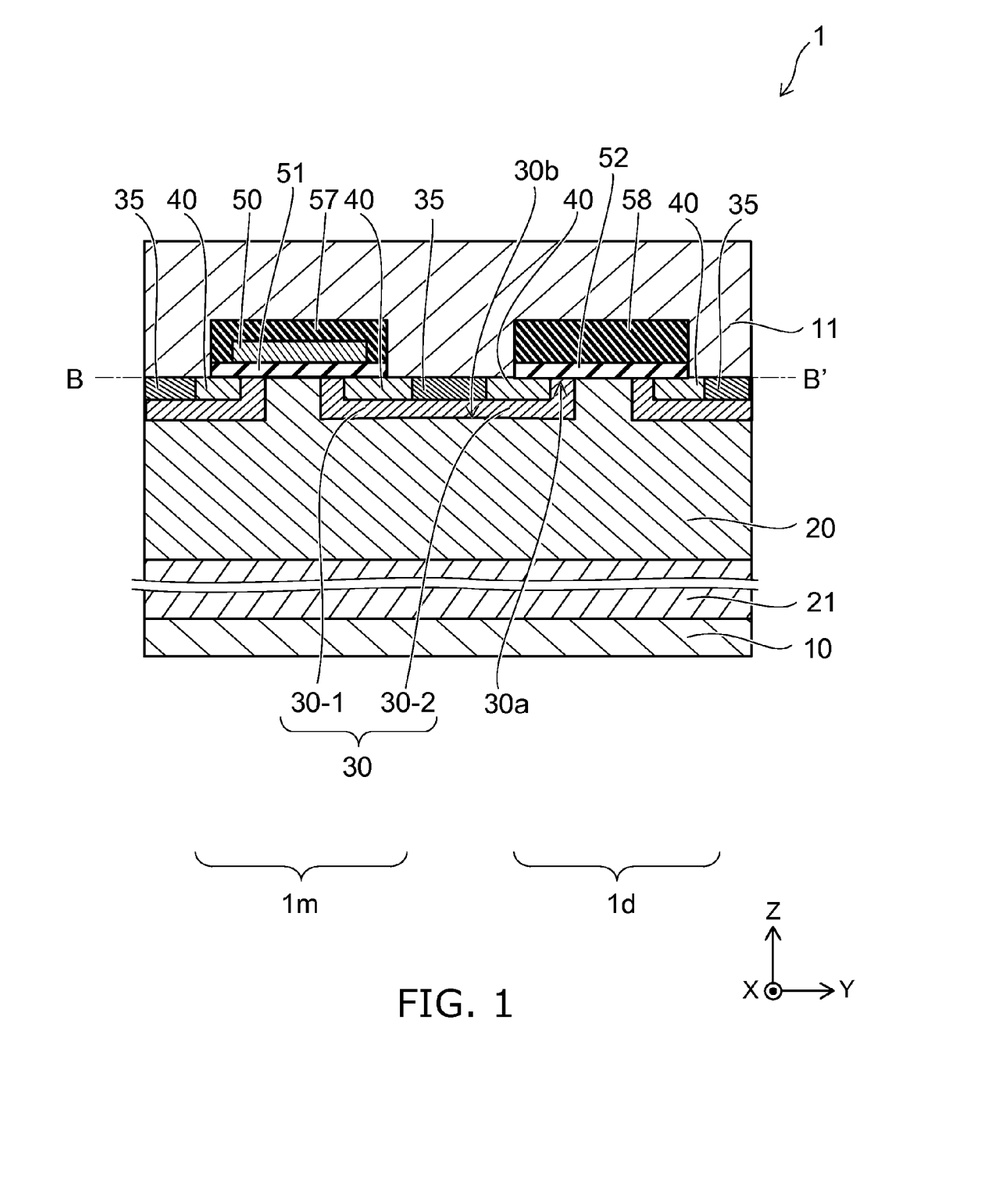
FIG. 1 is a schematic cross-sectional view illustrating a semiconductor device according to a first embodiment.

FIG. 1 is a schematic cross-sectional view illustrating a semiconductor device according to a first embodiment.

Figure 2:
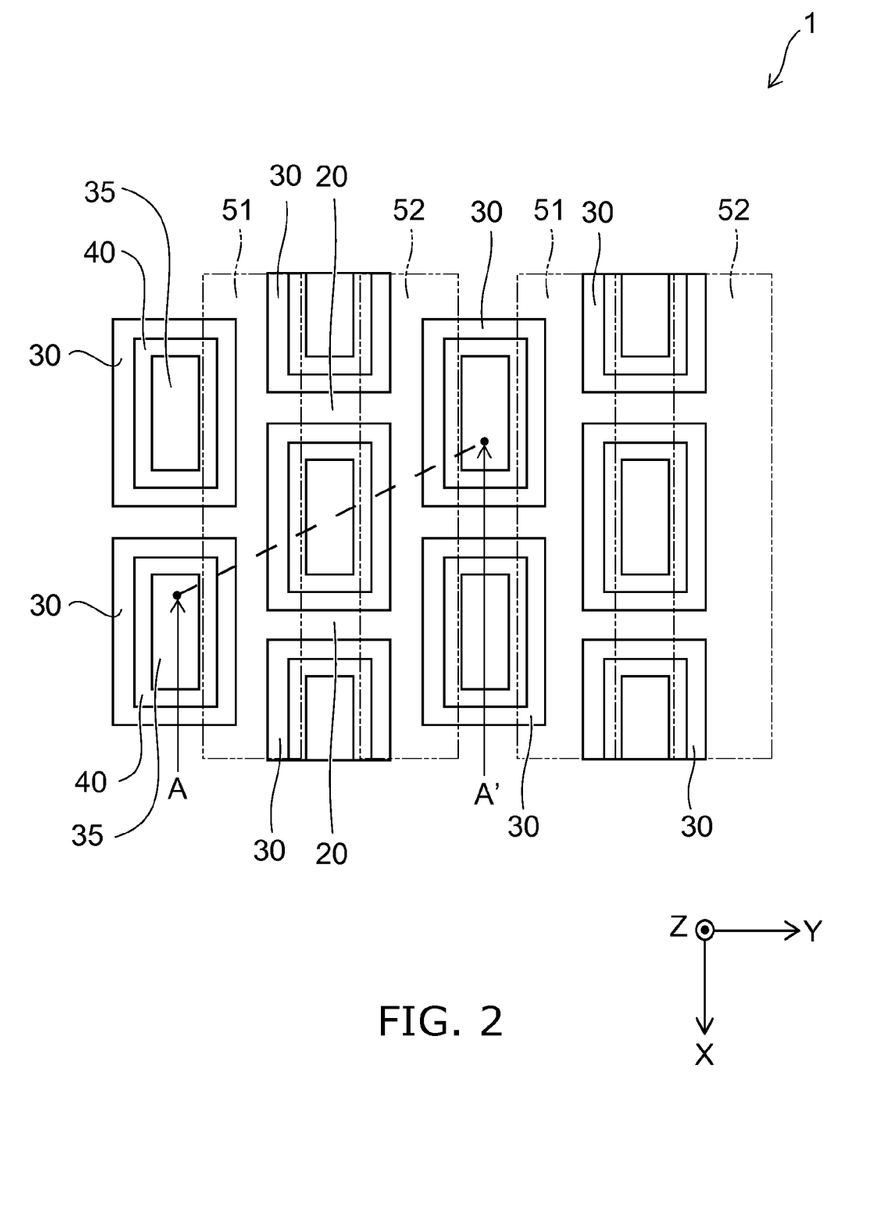
FIG. 2 is a schematic plan view illustrating the semiconductor device according to the first embodiment.

FIG. 2 is a schematic plan view illustrating the semiconductor device according to the first embodiment.

FIG. 1 shows the cross-section at a position along line A-A' in FIG. 2. FIG. 2 shows a cut section at a position along line B-B' in FIG. 1 when viewed from the upper surface.

As illustrated in FIG. 1, a semiconductor device 1 includes a metal oxide semiconductor field effect transistor (MOSFET) with a vertical electrode structure. The gate electrodes in the MOSFET are planar gates that extend in the horizontal direction of the semiconductor device 1. A diode is built into the semiconductor device 1. The semiconductor device 1 is used, for example, as a switching element for an electrical power circuit.

The semiconductor device 1 includes a drain electrode 10 (first electrode) and a source electrode 11 (second electrode). An n-type drift region 20 (first semiconductor region) is provided between the drain electrode 10 and the source electrode 11.

An $n^+$-type drain region 21 (second semiconductor region) is provided between the drift region 20 and the drain electrode 10. The impurity concentration of the drain region 21 is higher than the impurity concentration of the drift region 20.

A p-type base region 30 is provided between the drift region 20 and the source electrode 11. A base region 30-1 (third semiconductor region) and a base region 30-2 (fifth semiconductor region) are formed as the base region 30 to become the same region in the semiconductor device 1. An n+-type source region 40 (fourth semiconductor region) is provided between the base region 30 and the source electrode 11. The impurity concentration of the source region 40 is higher than the impurity concentration of the drift region 20. A p+-type contact region 35 is provided between the base region 30 and the source electrode 11. The impurity concentration of the contact region 35 is higher than the impurity concentration of the base region 30.

The contact region 35 functions as a region for fixing the potential of the base region 30. Since the contact region 35 is connected to the source electrode 11, the base region 30 also becomes a reference potential when the potential of the source electrode 11 becomes a reference potential.

A gate electrode 50 (third electrode) is in contact with the drift region 20, the base region 30-1, and the source region 40 via a gate insulating film 51 (first insulating film). An insulating film 52 (second insulating film) is in contact with the drift region 20, the base region 30-2, and the source region 40. The impurity concentration of a portion 30a where the base region 30-2 is in contact with the insulating film 52 is lower than the impurity concentration of a portion 30b where the base region 30 is in contact with the drift region 20. By controlling the potential of the gate electrode 50, the surface potential of the base region 30-1 can be modulated. On the other hand, the surface potential of the base region 30-2 is not modulated.

An insulating film 57 is provided between the gate electrode 50 and the source electrode 11. An insulating film 58 is provided between the insulating film 52 and the source electrode 11. In a thermal equilibrium state, the energy barrier between the drift region 20 and the portion 30a where the base region 30-2 is in contact with the insulating film 52 is lower than the energy barrier between the drift region 20 and the portion 30b where the base region 30 is in contact with the drift region 20. For example, the impurity concentration of the surface of the base region 30-2 is set to be lower than the impurity concentration of the base region 30 on the drain electrode 10 side. High-density interface states of approximately $1 \times 10^{12}$ cm$^{-2}$ eV$^{-1}$, which present at the interface between the base region 30-2 and the insulating film 52 (hereinafter, in the proximity of the MOS interface), is positively charged. The configuration (impurity concentration, interface level) of the base region 30-1 in contact with the gate insulating film 51 may be the same as the configuration of the base region 30-2 in contact with the gate insulating film 52 (hereinafter, the same).

Moreover, in the thermal equilibrium state, the difference between the energy barrier between the drift region 20 and the portion 30a where the base region 30 is in contact with the insulating film 52 and the energy barrier between the drift region 20 and the portion 30b where the base region 30 is in contact with the drift region 20, is 0.4 eV or higher.

For example, if the energy barrier between the drift region 20 and the portion 30b where the base region 30 is in contact with the drift region 20 is supposedly 3 eV, the energy barrier between the drift region 20 and the portion 30a where the base region 30-2 is in contact with the insulating film 52, would be 2.6 eV or less. For example, the energy barrier between the drift region 20 and the portion 30a where the base region 30-2 is in contact with the insulating film 52, is 1 eV. The energy barrier between the drift region 20 and the portion 30a where the base region 30-2 is in contact with the insulating film 52 in the semiconductor device 1 is adjusted at a desired value. One desired condition is to limit the energy imparted to the carrier in order to avoid the reduction of the dislocations existing inside the SiC crystal into partial dislocations thus producing stacking faults through carrier recombination. Since the binding energy of a Si—C bond is approximately 2.8 eV, reduction of the dislocation can be avoided if the energy imparted to the carrier is equal to or less than this value. Therefore, it is preferable to set the energy barrier between the drift region 20 and the portion 30a where the base region 30-2 is in contact with the insulating film 52 down to 2.6 eV or less by accounting thermal energy distribution of 0.2 eV.

On the other hand, electrons having energy that exceeds the energy barrier between the drift region 20 and the portion 30a where the base region 30-2 is in contact with the insulating film 52 and existing inside the source region 40 would overcome the barrier to reach the drift region 20 and become leakage current components when the transistor is in an OFF state. Accordingly, the energy barrier between the drift region 20 and the portion 30a where the base region 30-2 is in contact with the insulating film 52, is desired to be large. The concentration of electrons inside the source region 40 is typically approximately $1 \times 10^{20}$ cm$^{-3}$. The energy barrier between the drift region 20 and the portion 30a where the base region 30-2 is in contact with the insulating film 52 needs to be 0.83 eV or higher if the concentration of electrons in the energy barrier part between the drift region 20 and the portion 30a where the base region 30-2 is in contact with the insulating film 52 is limited to $1 \times 10^{12}$ cm$^{-3}$ or less in order to sufficiently reduce the leakage current at a device temperature of 250° C. That is, the energy barrier between the drift region 20 and the portion 30a where the base region 30-2 is in contact with the insulating film 52, is set to not less than 0.83 eV and not more than 2.6 eV. In order to limit energy consumption during reverse conduction, the barrier energy is preferably low and the setting value for the barrier energy may be 1 eV as an example in consideration of variation due to manufacturing.

In this way, a MOSFET provided with a source, a drain, and a gate is disposed in a region 1m in the semiconductor device 1. Moreover, a diode having the p-type portion 30a and the drift region 20 is disposed in a region 1d. Furthermore, a diode is configured by the base region 30 and the drift region 20. The energy barrier of the first diode is lower than the energy barrier of the second diode.

As illustrated in FIG. 2, sets of the base region 30, the source region 40, and the contact region 35 are disposed as islands on the drift region 20. The sets extend in a row in the X-direction and the rows are arranged in the Y-direction. The period of the sets in the respective rows may be in agreement or may be shifted as illustrated in FIG. 2.

In the embodiments, n+-type and n-type may be referred to as a first conductivity type, and p+-type and p-type may be referred to as a second conductivity type. The order of n+-type and n-type and the order of p+-type and p-type signify a decrease in the impurity concentrations.

The above-mentioned "impurity concentration" refers to an effective concentration of impurity elements that contribute to the conductivity of the semiconductor material. For example, if the semiconductor material contains an impurity element that is a donor and an impurity element that is an acceptor, the concentration excluding the portion canceled out by the donor and the acceptor among the activated impurity elements is the impurity concentration.

The drift region 20, the drain region 21, the base region 30, and the source region 40 include 4H-type silicon carbide. Nitrogen (N) and the like, for example, are used as the impurity element of the first conductivity type. Aluminum (Al), for example, is used as the impurity element of the second conductivity type.

The material of the electrodes is a metal that includes, for example, at least one selected from the group consisting of aluminum (Al), titanium (Ti), nickel (Ni), tungsten (W), molybdenum (Mo), copper (Cu), gold (Au), platinum (Pt), and a polysilicon and the like. The material of the insulating film is silicon oxide and the like.

An explanation of a semiconductor device and an electronic circuit according to a reference example will be provided before an explanation of the effects of the semiconductor device 1.

Figure 3A:
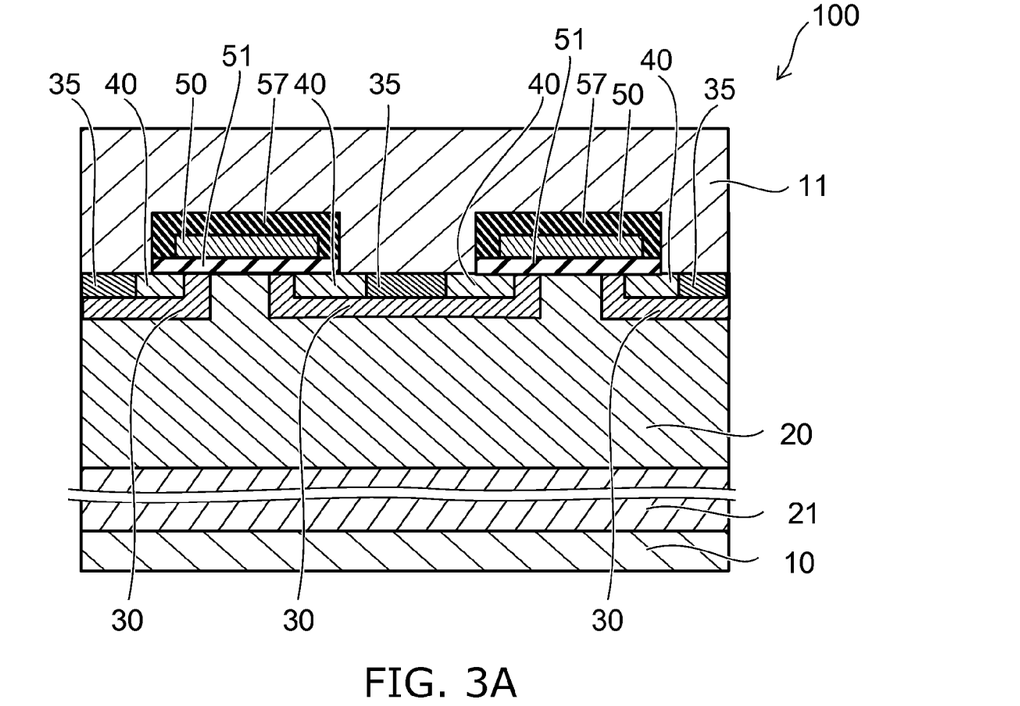
FIG. 3A is a schematic cross-sectional view of a semiconductor device according to a reference example.
Figure 3B:
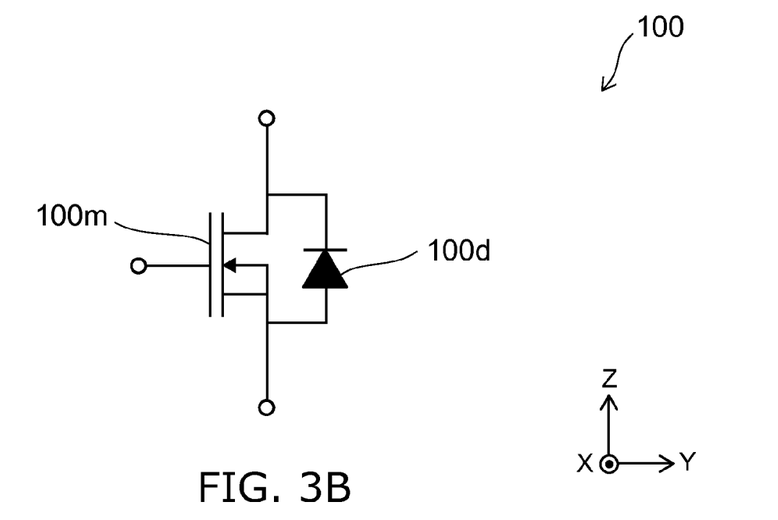
FIG. 3B is an equivalent circuit diagram of the semiconductor device shown in FIG. 3A.

FIG. 3A is a schematic cross-sectional view of a semiconductor device according to a reference example, and FIG. 3B is an equivalent circuit diagram of the semiconductor device shown in FIG. 3A.

A semiconductor device 100 illustrated in FIG. 3A is a general vertical electrode structure MOSFET. The drift region 20 having a predetermined impurity concentration is provided on the drain region 21. The base region 30 is provided on the drift region 20. The source region 40 and the contact region 35 are provided on the base region 30. The base region 30 is provided between the source region 40 and the drift region 20. The base region 30 functions as a potential barrier for obstructing electronic conduction between the source region 40 and the drift region 20.

The gate electrode 50 is provided above the source region 40, the base region 30, and the drift region 20 via the gate insulating film 51. The source electrode 11 is connected to the source region 40 and the contact region 35. The drain electrode 10 is connected to the drain region 21.

Normally, when the drain electrode 10 is positively biased with respect to the source electrode 11 and the gate electrode 50 is positively biased with respect to the source electrode 11, an electron channel is formed in the base region 30 along the interface between the base region 30 and the gate insulating film 51, and a current flows between the drift region 20 and the source region 40 (ON state).

On the other hand, if the electric potential of the gate electrode 50 with respect to the source electrode 11 is lowered, the electron concentration induced in the base region 30 decreases and conduction between the source and drain is cut off (OFF state). When the electric current is cut off, a depletion layer extends from the base region 30 toward the drift region 20 and a voltage difference is produced between the source and the drain. The impurity concentration and thickness of the drift region 20 are set so as to maintain a desired breakdown voltage.

The following is an explanation of a reverse conduction state of the semiconductor device 100.

When the drain side is negatively biased with respect to the source side, the base region 30 is positively biased with respect to the drift region 20. When an applied voltage of a pn diode between the base region 30 and the drift region 20 is exceeded, an electric current then flows from the source side toward the drain side (reverse conduction state). A diode formed between the base region 30 and the drift region 20 is called a built-in diode.

The semiconductor device 100 represented as a circuit is illustrated in FIG. 3B. The semiconductor device 100 includes a MOSFET 100m and a built-in diode 100d. The semiconductor device 100 is used in a circuit for driving an inductive load.

Figure 4A:
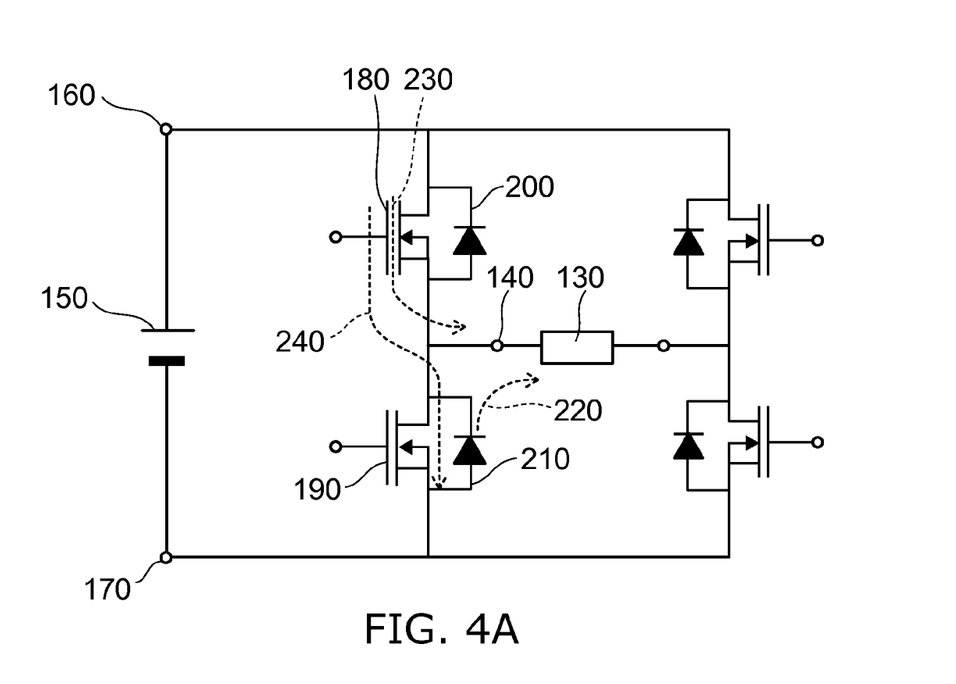
FIG. 4A and FIG. 4B are circuit diagrams illustrating electronic circuits according to the reference example.
Figure 4B:
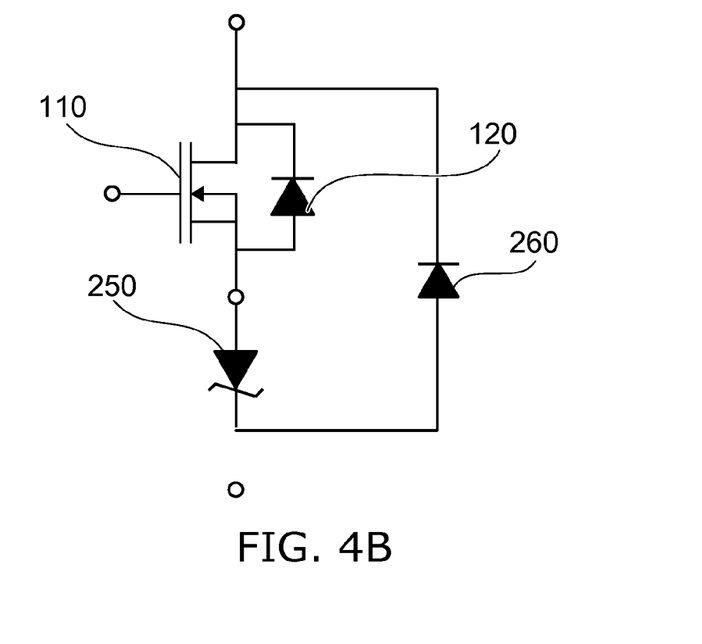

FIG. 4A and FIG. 4B are circuit diagrams illustrating electronic circuits according to the reference example.

FIG. 4A illustrates a DC-AC conversion circuit (inverter circuit) based on an H-bridge. A load terminal 140 of an inductive load 130 in the inverter circuit is connected to a cathode 160 and an anode 170 of a direct current source 150 via a MOSFET. A MOSFET 180 is provided between the cathode 160 of the direct current source 150 and the load terminal 140 and a MOSFET 190 is provided between the anode 170 of the direct current source 150 and the load terminal 140, in order to regulate the increase and decrease of the load current.

Since the load becomes inductive, a large surge voltage is produced when the load current is suddenly cut off, and there is a possibility that the elements inside the circuit may break down. Accordingly, freewheeling diodes 200 and 210 are connected in parallel to each of the MOSFETs. Since each of the freewheeling diodes has the same connection conditions as the built-in diode in the MOSFET, if the built-in diode can be used as a freewheeling diode, the elements in the electronic circuit can be reduced and thus the circuit can be made more compact and costs can be reduced. However, a number of difficulties arise when the built-in diode in a MOSFET is used as a freewheeling diode in a MOSFET.

For example, in order to reduce the on-resistance of the MOSFET, the crystal quality of the drift region 20 is improved, which leads to a long carrier lifetime of the drift region 20. Then the reverse recovery time of the built-in diode becomes large.

Assuming that the circuit in FIG. 4A is initially under regenerative mode, where the MOSFET 180 is at OFF state, and a load current flows from the negative terminal 170 of the battery 150 through the freewheeling diode 210 as indicated by reference numeral 220, and that the MOSFET 180 is turned on, the load current switches to flow from the positive terminal 160 of the battery 150 through the MOSFET 180 as indicated by reference numeral 230. At this time, a through-current 240 flows in which the direct current source 150 is short-circuited through the MOSFET 180 and the freewheeling diode 210 while the freewheeling diode 210 is undergoing a reverse recovery. As a result, circuit loss increases. Therefore, usually, a built-in diode in a MOSFET has not been used as-is as a freewheeling diode in a circuit such as an inverter circuit in which a better conversion efficiency is desired.

For an application focusing on conversion efficiency, there is another method in which a diode 250 is connected in series to the source side of a MOSFET 110 to prevent the built-in diode 120 in the MOSFET 110 from being forward-biased and an external diode 260 is connected to maintain the reverse conduction as illustrated in FIG. 4B.

In this case, the external diode 260 is a high-speed diode that reduces the reverse recovery time and loss due to a through-current is reduced. The diode 250 is an element with a small forward potential drop such as a Schottky diode. As a result, forward direction loss is reduced. However, there is a need to increase the number of external elements and thus the size of the circuit may increase and costs may rise.

In order to address these issues, the switching performance of the built-in diode needs to be improved and the built-in diode needs to be used as a freewheeling diode. Here, a method to improve the switching performance of the built-in diode includes introducing a crystal defect in the drift region to shorten the carrier lifetime. However, this method leads to an increase in resistance in the drift region, that is, an increase in the on-resistance, and it is not possible to achieve both a decrease in conduction loss and a decrease in switching loss.

Moreover, in addition to these issues, while there is a method using 4H-type silicon carbide with a higher breakdown voltage than silicon as the element material, the aforementioned reliability becomes a problem in this case.

Under these conditions, in an inverter circuit and the like, there is a method which involves using a MOSFET provided with a MOS modulate type diode (hereinafter, referred to as MCD) in which a surface barrier of the built-in diode in the MOSFET is modulated with a MOS gate.

Figure 5A:
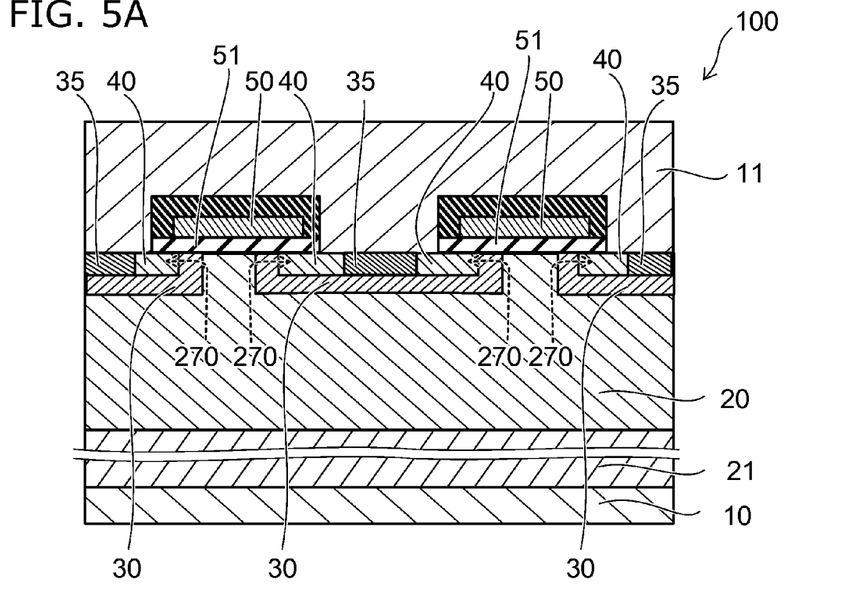
FIG. 5A is a schematic cross-sectional view of the semiconductor device according to the reference example.
Figure 5B:
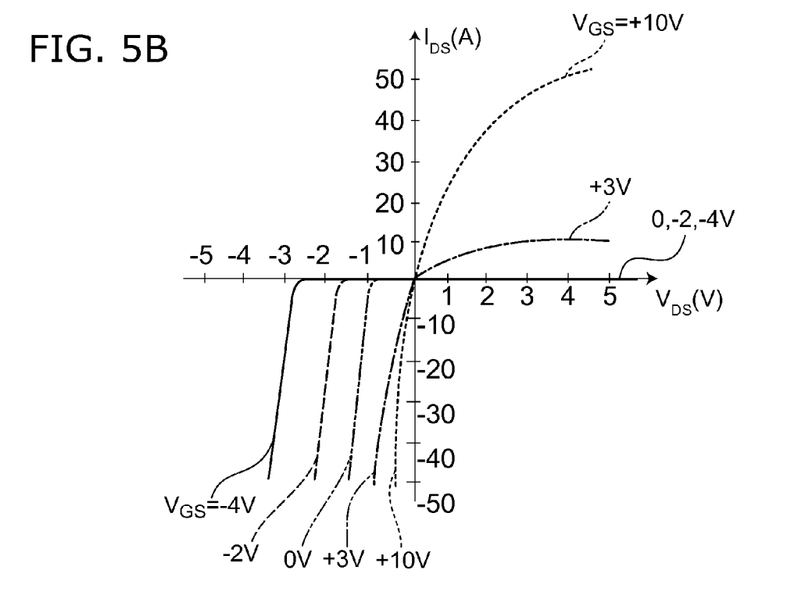
FIG. 5B is a current-voltage relationship curve of the semiconductor device according to the reference example.

FIG. 5A is a schematic cross-sectional view of the semiconductor device according to the reference example, and FIG. 5B is a current-voltage relationship curve of the semiconductor device according to the reference example.

An electron barrier of the base region 30 in the proximity of the MOS interface in the MCD in the semiconductor device 100 illustrated in FIG. 5A is lower than a potential barrier of a normal pn diode configured by the base region 30 and the drift region 20.

For example, with the method of applying a bias to the gate electrode 50, the electron barrier of the base region 30 in the proximity of the MOS interface can be set to be lower than the potential barrier of a normal pn diode. This is called a first MCD.

Moreover, with the method reducing the impurity concentration of the base region 30 in the proximity of the MOS interface or introducing a fixed charge to the MOS interface, the electron barrier of the base region 30 in the proximity of the MOS interface can be set to be lower than the potential barrier of a normal pn diode. This is called a second MCD.

In these MCDs, the drain side is negatively biased and the source side is positively biased, and when the voltage between the drain and the source becomes higher than the potential barrier of the base region 30 in the proximity of the MOS interface, an electron current 270 overcomes the potential barrier of the base region 30 in the proximity of the MOS interface and the electron current 270 begins to flow from the drain side toward the source side. At this time, since the potential barrier of the drift region 20 becomes the potential barrier of a normal p-n junction with regard to the positive holes in the base region 30, the positive holes are not injected from the base region 30 into the drift region 20.

That is, if the MCDs are used, no accumulation of minority carriers occurs inside the drift region 20 and the reverse recovery time of the diode is shortened. Furthermore, a MOSFET that uses 4H—SiC is able to avoid increasing of defects associated with the recombination process of minority carriers.

However, a new problem arises even when the MCDs are used as described below.

The use of the first MCD will be described first. In a state in which the potential between the gate and the source is zero in the first MCD, the electron barrier of the base region 30 in the proximity of the MOS interface is approximately the same as the potential barrier of the p-n junction. When a positive potential is applied between the gate and the source, the barrier between the drain and the source is lowered and an electron current begins to flow from the drain side toward the source side.

When MOSFETs including the first MCD are applied to the above-mentioned inverter circuit, the MOSFETS 180 and 190 above and below each other must be off during the moment when the polarity of the connection of the load terminal 140 and the direct current source 150 switches. If both the above and below MOSFETS 180 and 190 are on at the same time, the direct current source 150 will be short-circuited. This leads to a large electrical power loss.

However, when gate potentials of the above and below MOSFETS 180 and 190 are biased down to an OFF state, the MCDs also turned off. Therefore, the built-in diode (normal pn diode) of either of the above or below MOSFET 180 or 190 operates according to the direction of the load current in a dead time period in which both of the MOSFETS 180 and 190 are off.

After the dead time, the MCDs can be operated (synchronous rectification mode) if the voltage between the gate and the source of the desired MOSFET is switched to positive in accordance with the direction of the load current. However, since a body diode of the MOSFET operates even during a short time period in the dead time, positive holes are injected into the drift region 20. That is, the reliability of the MOSFET is reduced.

In contrast, the use of the second MCD will be described. The electron barrier of the base region 30 in the proximity of the MOS interface is set to be lower than the potential barrier of a normal pn diode in the second MCD while the voltage between the gate and the source goes from zero to the MOSFET threshold voltage.

With this type of MOSFET, the voltage between the gate and the source is set to be within the range from zero to the threshold voltage in the dead time, and the MCD operates in accordance with the direction of the load current even if the MOSFET is off. Therefore, the injection of positive holes from the base region 30 of the body diode (normal pn diode) toward the drift region 20 is less likely to occur with the second MCD.

However, the range of a gate voltage in which the second MCD is able to operate appropriately is very small. Therefore, it is actually difficult to operate an inverter circuit using the second MCD. This phenomenon is described below.

FIG. 5B shows the current-voltage characteristics between the drain and the source of a MOSFET having the second MCD. The horizontal axis represents the drain-source voltage ($V_{DS}$) and the vertical axis represents the drain-source current ($I_{DS}$).

The gate threshold during forward direction operation is 2.5 V in the MOSFET. The drain current flows in the forward direction when the gate-source voltage ($V_{GS}$) reaches 2.5 V or higher in the MOSFET.

On the other hand, when the gate-source voltage reaches 0 V in the reverse direction, the drain current flows in the reverse direction from when the drain-source voltage becomes approximately −1 V. That is, the results in FIG. 5B show that the MCD in the MOSFET operates normally.

When the gate-source voltage increases on the minus side, the electron barrier of the base region 30 in the proximity of the MOS interface increases. As a result, the turn-on voltage of the MCD increases on the minus side and the turn-on voltage approaches −2 V when the gate-source voltage is −2 V. Furthermore, the turn-on voltage becomes saturated near −3 V when the gate-source voltage becomes −4 V or less.

When the gate-source voltage becomes −4 V or less, an accumulation of positive holes occurs in the base region 30 in the proximity of the MOS interface. At this time, the electron barrier of the base region 30 is approximately the same as or higher than the electron barrier of a normal p-n junction and thus there is a possibility that positive holes are injected from the base region 30 to the drift region 20.

Therefore, in order to prevent positive holes from being injected from the base region 30 to the drift region 20, the gate-source voltage must be precisely controlled to be within a range of −2 V to +2 V. Within this range, the body diode does not operate and only the MCD operates. However, the inverter circuit may actually malfunction when this type of control is performed.

Figure 6:
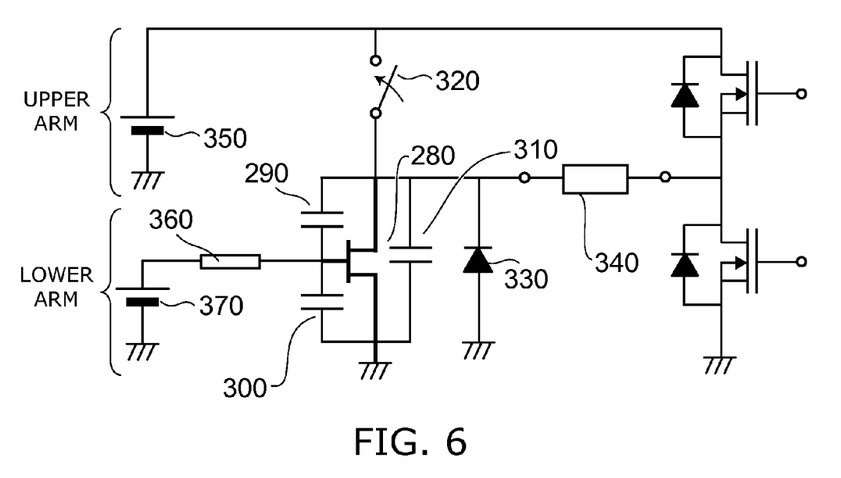
FIG. 6 is a circuit diagram illustrating an electronic circuit according to the reference example.

FIG. 6 is a circuit diagram illustrating an electronic circuit according to the reference example.

Figure 7A:
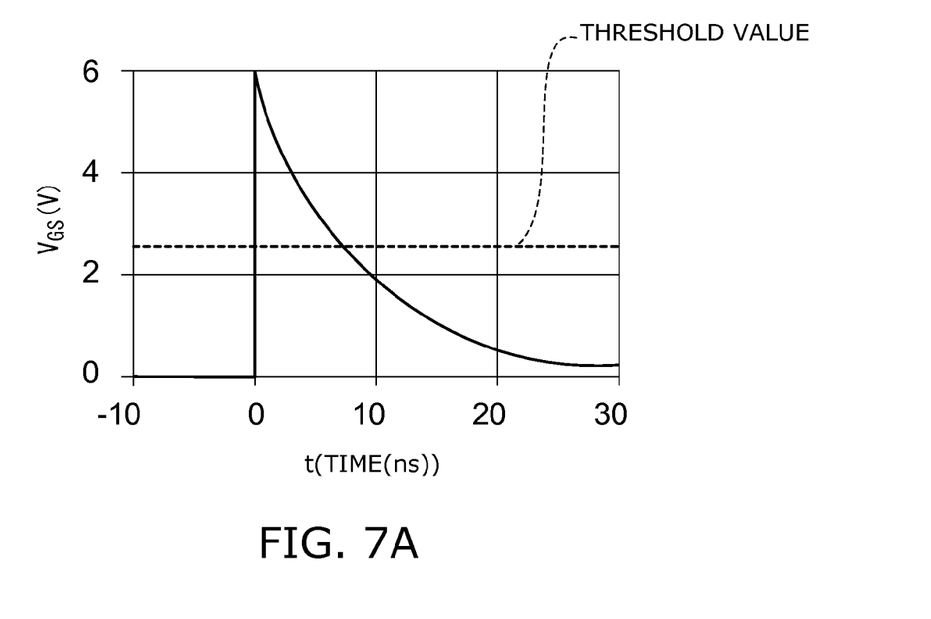
FIG. 7A and FIG. 7B show the relationship between time and the gate-source voltage in an electronic circuit according to the reference example.
Figure 7B:
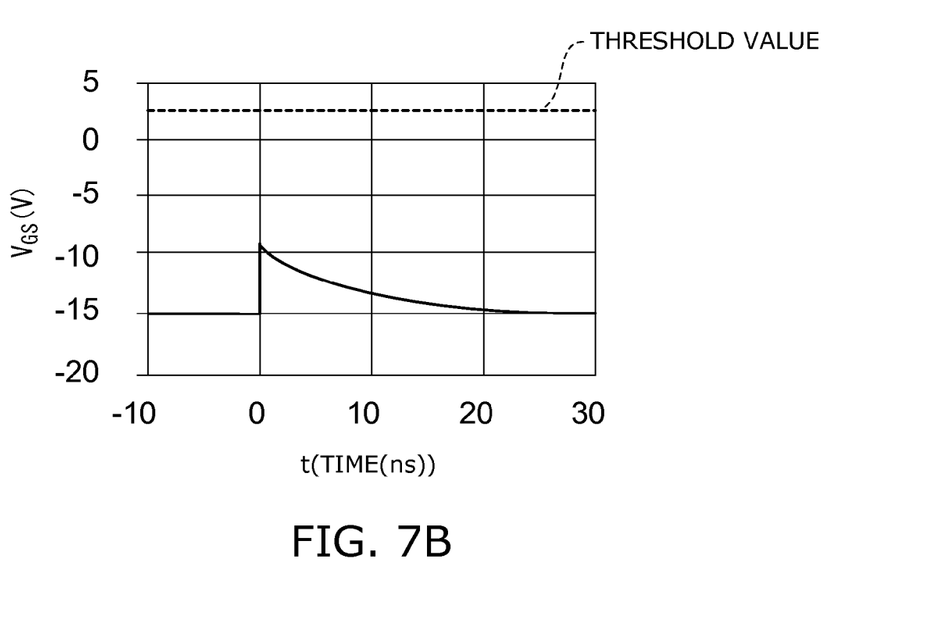

FIG. 7A and FIG. 7B show the relationship between time and the gate-source voltage in an electronic circuit according to the reference example.

A MOSFET 280 corresponds to a switch element in a lower arm of an inverter circuit. A capacitance 290 is a drain-gate capacitance $C_{DG}$, and is, for example, 20 pF. A capacitance 300 is a gate-source capacitance $C_{GS}$, and is, for example, 2000 pF. A capacitance 310 is a drain-source capacitance $C_{DS}$, and is, for example, 150 pF. A switching element on an upper arm is illustrated in a simplified manner as a switching element 320.

A state is assumed in which the upper arm is off and the lower arm is also off and a current is supplied from the negative terminal of a main power source 350 to a load 340 through a MCD 330 in the lower arm. The gate-source voltage of the MOSFET 280 in the lower arm is supplied from a power source 370 ($V_{GG}$) through a gate resistance 360 ($R_{GG}$). In this case, $V_{GG}$ is set to 0 V in order to allow the MCD to operate. The gate resistance ($R_{GG}$) is 4Ω. The voltage $V_{CC}$ of the main power source 350 is 600 V.

From this state, it is assumed that the switching element 320 in the upper arm is on and the supply of the load current is switched to the positive terminal of the main power source 350. The gate-source voltage $V_{GS}$ of the MOSFET 280 in the lower arm changes according to the following formula (1) due to the potential current flowing through the drain-gate capacitance $C_{DG}$ and the gate-source capacitance $C_{GS}$ at the time of the switching:

$$V_{GS}=V_{GG}+(C_{DG}/(C_{DG}+C_{GS}))\cdot v_{CC}\cdot \exp(-t/((C_{DG}+C_{GS})R_{GG}))$$ formula (1)

A time t shown in FIG. 7A is a time period from immediately after the switching. When $V_{GG}$ is 0V in formula (1), $V_{GS}$ changes as shown in FIG. 7A. However, during 0 to 7 (ns) of the time t, the threshold of 2.5 V is exceeded and the MOSFET 280 in the lower arm becomes conductive.

This means that the main power source 350 is short-circuited and a large loss is produced due to the upper arm and the lower arm both being in the ON state.

The easiest means to prevent the error-on phenomenon of the gate electrode due to the displacement current at the time of the switching, in formula (1), is to negatively bias the applied voltage $V_{GG}$ between the gate and the source.

For example, FIG. 7B shows the state of fluctuations of the gate-source voltage $V_{GS}$ when $V_{GG}$ is set to approximately −15 V. According to FIG. 7B, the maximum value of the $V_{GS}$ is −9 V and is lower than the threshold voltage (+2.5 V). That is, an error-on of the lower arm can be reliably prevented.

However, the operation of the MCD deviates when such a large negative bias is supplied between the gate and the source. More specifically, in the reverse conduction mode, positive holes are injected from the base region 30 to the drift region 20. Thus, minority carriers accumulate in the drift region 20 and the reverse recovery loss increases. Moreover, stacking faults are generated in the 4H—SiC crystals and reliability of the semiconductor device decreases.

In contrast, if the semiconductor device 1 according to the first embodiment is used, the injection of positive holes toward the drift region 20 is suppressed and an increase in reverse recovery loss and the expansion of defects can be prevented. Moreover, if the semiconductor device 1 is used, a large negative bias can be applied between the gate and the source in order to prevent the error-on during the switching. Hereinafter, the effects of the semiconductor device 1 according to the first embodiment will be described in detail.

Figure 8A:
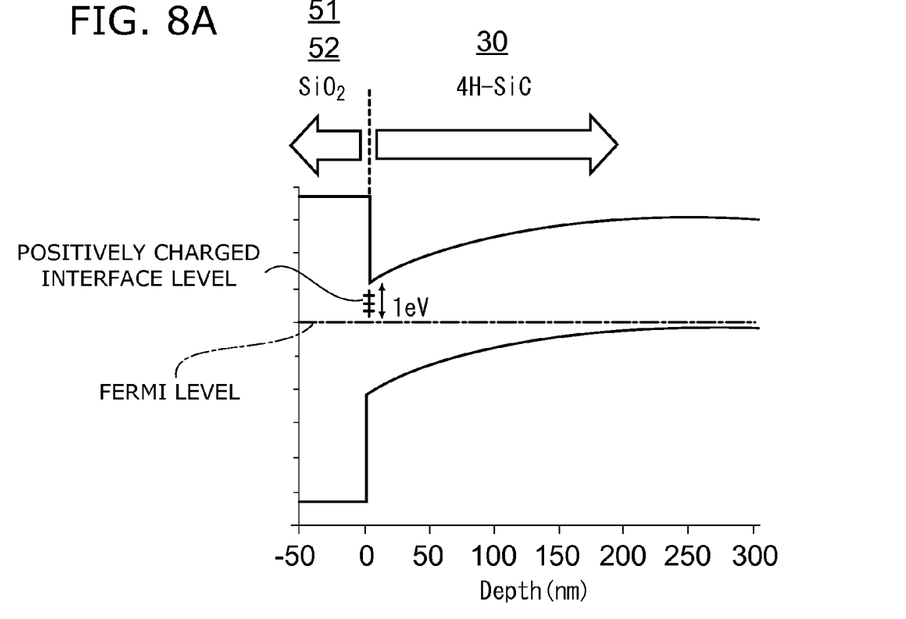
FIG. 8A and FIG. 8B illustrate energy bands of a semiconductor device according to the first embodiment.
Figure 8B:
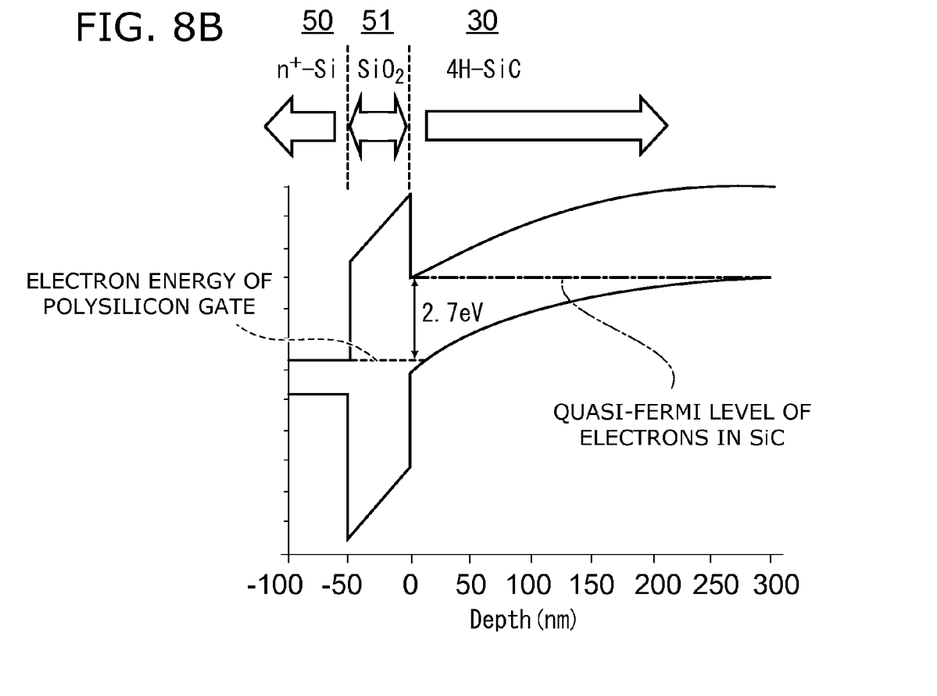

FIG. 8A and FIG. 8B illustrate energy bands of a semiconductor device according to the first embodiment.

In the state shown in FIG. 8A, the interface level of the base region 30 in contact with the gate insulating film 51 (or the insulating film 52) is a level of a donor-type that is neutral when electrons are captured and positively charged when electrons are released. The interface level is uniformly distributed in an energy range within the forbidden band.

In this case, if the acceptor concentration of the base region 30 is assumed to be $5\times10^{16}$ (atoms/cm$^3$), the height of the electron barrier of the base region 30 from the Fermi level in the thermal equilibrium state becomes approximately 1 eV in a state in which an electric field applied to the gate insulating film 51 (or the insulating film 52) becomes zero.

Next, FIG. 8B shows a state in which the gate electrode 50 is added. The thickness of the gate insulating film 51 is 50 nm. The gate electrode 50 includes an n-type polysilicon.

If an electron channel is formed when the electron quasi-Fermi level reaches the conduction band of SiC, the electric field strength of the base region 30 in the proximity of the MOS interface becomes approximately 200 kV/cm.

A state is presumed in which an interface level that is lower than the Fermi level is neutral and the density of electrons induced in the MOS interface is low. The electric flux densities inside the base region 30 and inside the gate insulating film 51 are equal and the electric field strength inside the gate insulating film 51 is approximately 460 kV/cm. Therefore, the threshold of the gate-source voltage is estimated to be approximately 2.7 V.

In this way, when the electric field strength in the gate insulating film 51 is extremely low and approaching zero, the electron barrier of the base region 30 in the proximity of the MOS interface with respect to the drift region 20 can be set to 1 eV, and moreover the gate threshold of the MOSFET can be set to 2 V to 3 V.

The MOSFET operates in the region 1m in which the gate electrode 50 is provided on the base region 30 in the semiconductor device 1 illustrated in FIG. 1. On the other hand, the MCD operates in the region 1d that does not include the gate electrode 50. That is, when the potential of the drain side is lower than the potential of the source side, electrons flow from the drift region 20 to the base region 30 in the proximity of the MOS interface, and flow to the source region 40. Regardless of the potential of the gate electrode 50 here, the field strength in the insulating film 52 is maintained at a low level. Therefore, the electron barrier of the base region 30 in the proximity of the MOS interface with respect to the drift region 20 is maintained at 1 eV. The thickness of the gate insulating film 51 and the thickness of the insulating film 52 in the semiconductor device 1 are 50 nm. The material of the gate electrode 50 includes an n-type polysilicon.

Figure 9:
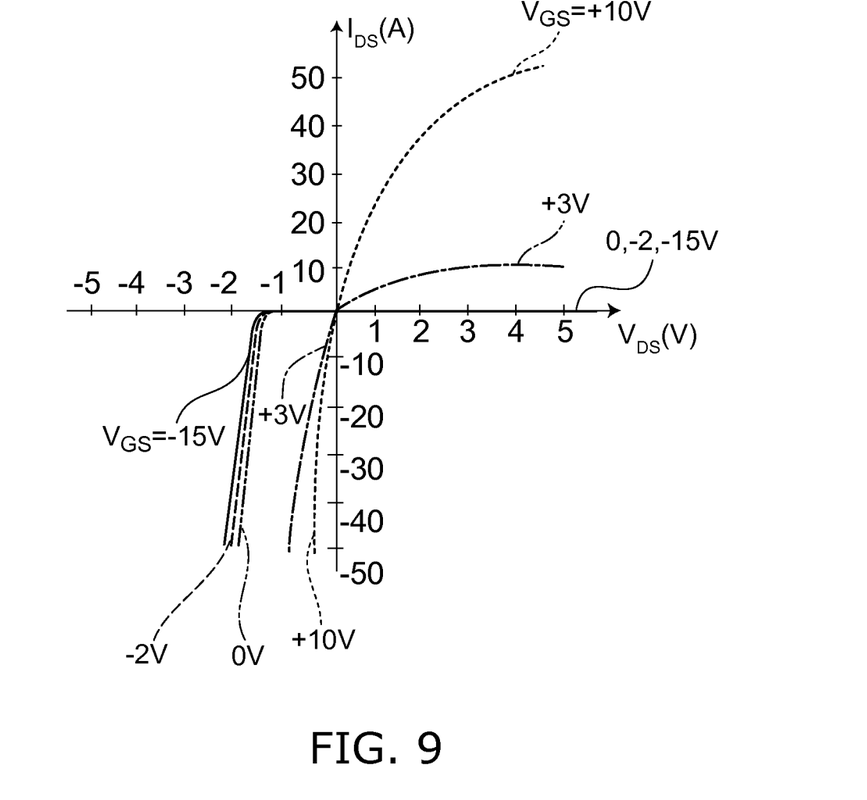
FIG. 9 is a current-voltage relationship curve of the semiconductor device according to the first embodiment.

FIG. 9 is a current-voltage relationship curve of the semiconductor device according to the first embodiment.

The horizontal axis represents the drain-source voltage ($V_{DS}$) and the vertical axis represents the drain-source current ($I_{DS}$). The gate-source voltage ($V_{GS}$) increases on the minus side and the MCD operates independently of the gate voltage even if positive holes accumulate in the base region 30 in the proximity of the MOS interface in the semiconductor device 1. As a result, the on-voltage ($V_{DS}$) of the reverse conduction diode is fixed at approximately −1 V even if the gate-source voltage ($V_{GS}$) increases on the minus side. The MCD operates even if the gate-source voltage ($V_{GS}$) is −15 V.

That is, the above-mentioned error-on can be reliably prevented through the use of the semiconductor device 1. Moreover, conduction loss in the reverse direction is reduced since the on-voltage of the built-in diode is low, and the injection of positive holes in the drift region 20 is suppressed in the semiconductor device 1. That is, both a reduction in reverse recovery loss and an improvement in reliability due to the suppression of defect expansion can be achieved.

In this way, the gate potential is set to a more negative value than the source potential in a reverse conduction state in which the drain potential is lower than the source potential. The barrier potential of the drift region 20 and of the base region 30 in the proximity of the MOS interface is in a range of 0.8 eV to 2.6 eV in a state in which the base region 30 under the gate electrode 50 is in a p-type accumulation state.

As a result, an electron current flows from the drain side to the source side when the drain potential is in a range of 0.8 V to 2.6 V with respect to the source potential. That is, a current flows from the source side to the drain side when the drain potential is in a range of 0.8 V to 2.6 V with respect to the source potential. That is, the injection of positive holes from the base region 30 toward the drift region 20 does not occur since the on-voltage of the reverse conduction diode is lower than the on-voltage of the p-n junction of the 4H-type silicon carbide. As a result, switching loss of the reverse conduction diode can be reduced without the occurrence of an accumulation of excess carriers in the drift region 20 in the reverse conduction state in the semiconductor device 1. Further, a highly reliable semiconductor device can be realized without the expansion of crystal defects caused by the electron-positive hole recombination.

Moreover, an external element for adding the reverse conduction function is made unnecessary if the semiconductor device 1 is used in an inverter circuit. As a result, a compact and low-cost electronic circuit can be achieved. Since the on-voltage of the reverse conduction diode is lower than that of the conventional built-in diode configured with the p-n junction, conduction loss is reduced in the reverse conduction state.

Furthermore, a sufficiently large negative gate voltage (for example, −15 V) can be supplied when the semiconductor device 1 is in the OFF state. As a result, malfunctions during switching can be prevented.

Second Embodiment

Figure 10:
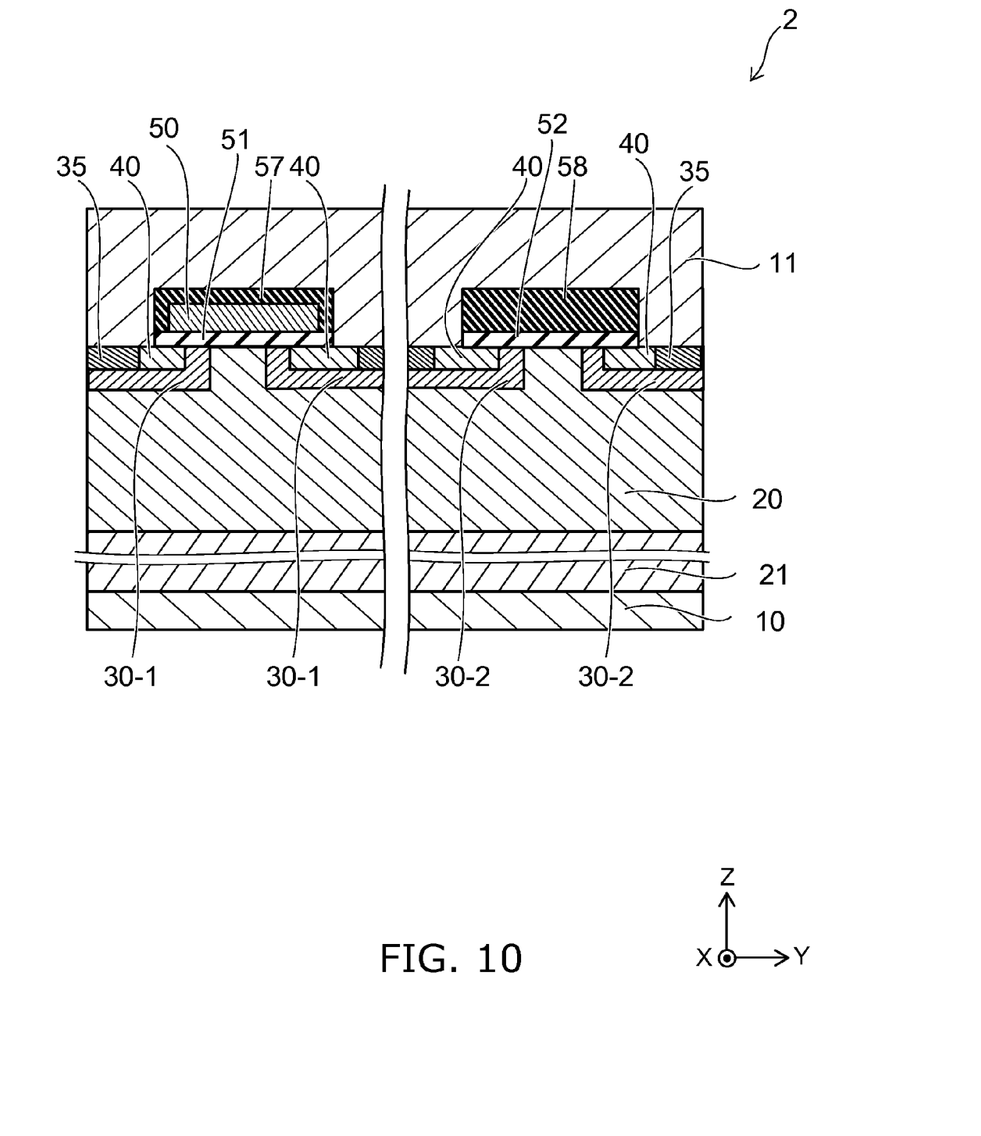
FIG. 10 is a schematic cross-sectional view illustrating a semiconductor device according to a second embodiment.

FIG. 10 is a schematic cross-sectional view illustrating a semiconductor device according to a second embodiment.

While FIG. 1 illustrates an example in which the gate insulating film 51 and the insulating film 52 are in contact with the same base region 30, the present invention is not limited to this example. That is, as shown in a semiconductor device 2 illustrated in FIG. 10, the base region 30 with which the gate insulating film 51 is in contact and the base region 30 with which the insulating film 52 is in contact may be disposed away from each other.

In this case, the gate electrode 50 is in contact with the drift region 20, any of the base regions 30-1 among the plurality of base regions 30, and the source region 40 via the gate insulating film 51. Further, the insulating film 52 is in contact with the drift region 20, the base region 30-2 that is not any of the above-mentioned base regions 30-1, and the source region 40. Moreover, the number of the gate electrodes 50 and the number of the insulating films 52 do not necessarily have a one-to-one correspondence, and the numbers of the gate electrodes 50 and the insulating films 52 may be changed as appropriate.

Third Embodiment

Figure 11:
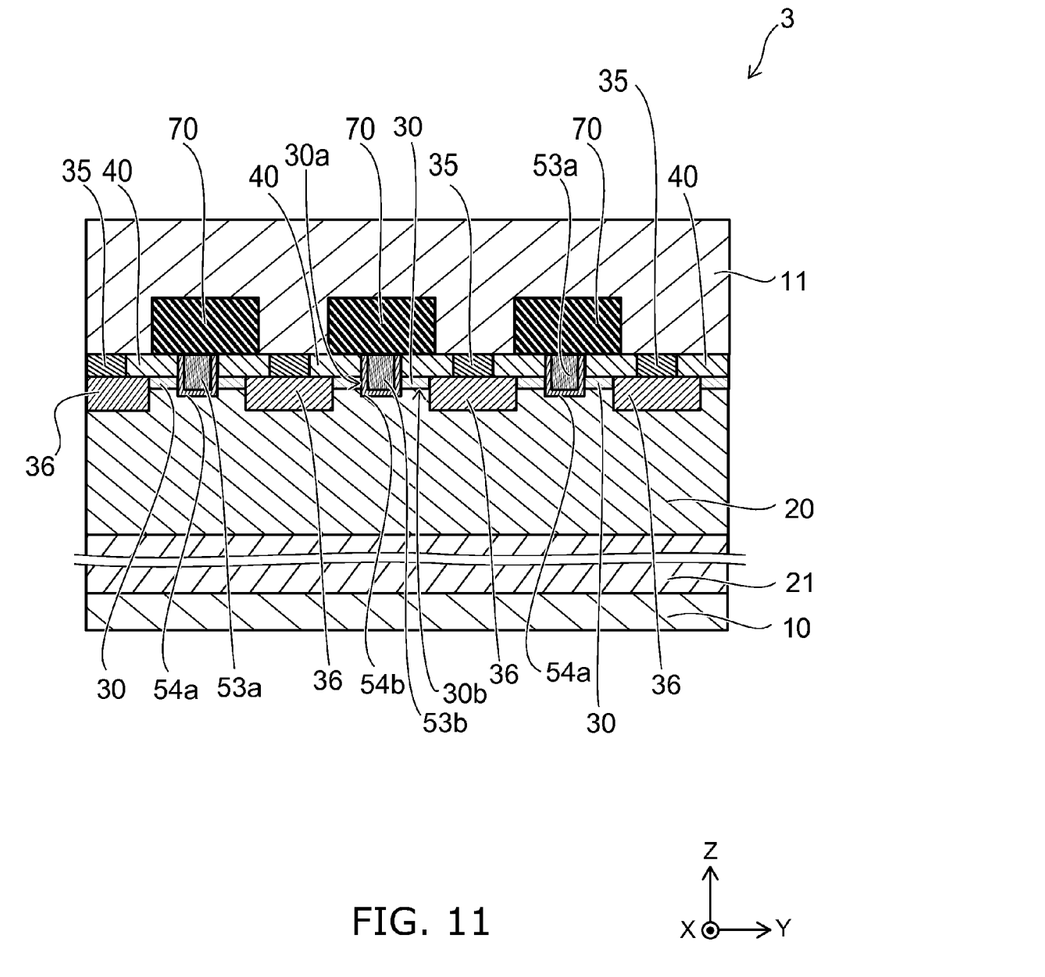
FIG. 11 is a schematic cross-sectional view illustrating a semiconductor device according to a third embodiment.

FIG. 11 is a schematic cross-sectional view illustrating a semiconductor device according to a third embodiment.

A semiconductor device 3 illustrated in FIG. 11 includes a trench gate-type of MOSFET. The semiconductor material of the semiconductor device 3 includes silicon carbide.

The semiconductor 3 includes the drain electrode 10 and the source electrode 11. The n-type drift region 20 is provided between the drain electrode 10 and the source electrode 11. The $n^+$-type drain region 21 is provided between the drift region 20 and the drain electrode 10.

The p-type base region 30 is provided between the drift region 20 and the source electrode 11. The $n^+$-type source region 40 is provided between the base region 30 and the source electrode 11. The contact region 35 is connected to the source region 40 and the source electrode 11. Moreover, a $p^+$-type contact region 36 is provided between the contact region 35 and the drift region 20.

A gate electrode 53a is in contact with the drift region 20, the base region 30, and the source region 40 via a gate insulating film 54a. Moreover, an electrode 53b is provided so as to be adjacent to the gate electrode 53a. The electrode 53b is in contact with the drift region 20, the base region 30, and the source region 40 via an insulating film 54b. Here, the electrode 53b is electrically connected to the source electrode 11 and has a fixed potential.

The impurity concentration of the portion 30a where the base region 30 is in contact with the insulating film 54 is lower than the impurity concentration of the portion 30b where the base region 30 is in contact with the drift region 20. An insulating film 70 is provided between the gate electrode 53a and the source electrode 11 and between the electrode 53b and the source electrode 11.

For example, if the energy barrier between the drift region 20 and the portion 30b where the base region 30 is in contact with the drift region 20 is hypothetically 3 eV, the energy barrier between the drift region 20 and the portion 30a where the base region 30 is in contact with the insulating film 54b, is 1 eV. The threshold of the gate electrode 53a is set to approximately 3 V. The configuration (impurity concentration, interface level) of the base region 30 in contact with the gate insulating film 54 may be the same as the configuration of the base region 30 in contact with the gate insulating film 54b.

Further, the contact region 36 deeper than the gate electrode 53a is provided below the contact region 35 so that the high electrical field does not reach the gate electrode 53a when the potential of the drain side increases.

Here, an accumulation layer of positive holes and an electron channel are produced in accordance with the gate voltage in the base region 30 in contact with the gate electrode 53a via the gate insulating film 54a and the base region 30 becomes a portion of the MOSFET. On the other hand, the base region 30 in contact with the electrode 53b via the insulating film 54b becomes a portion of the MCD without relying on the gate voltage.

The effects of the third embodiment are the same as those of the first embodiment. While the gate electrode 53a and the electrode 53b are arranged alternately, this arrangement is merely an example.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode; and
a first semiconductor region of a first conductivity type provided between the first electrode and the second electrode;
a second semiconductor region of the first conductivity type provided between the first semiconductor region and the first electrode, the second semiconductor region having a higher impurity concentration than the first semiconductor region;
a third semiconductor region of a second conductivity type provided between the first semiconductor region and the second electrode;
a fifth semiconductor region of the second conductivity type provided between the first semiconductor region and the second electrode;
a fourth semiconductor region of the first conductivity type provided between the third semiconductor region and the second electrode and between the fifth semiconductor region and the second electrode, the fourth semiconductor region having a higher impurity concentration than the first semiconductor region;
a third electrode in contact with the first semiconductor region, the third semiconductor region, and the fourth semiconductor region via a first insulating film; and
a second insulating film in contact with the first semiconductor region, the fifth semiconductor region, and the fourth semiconductor region,
an impurity concentration of a portion where the fifth semiconductor region is in contact with the second insulating film is lower than an impurity concentration of a portion where the fifth semiconductor region on a side of the first electrode is in contact with the first semiconductor region.

2. The device according to claim 1, wherein the third semiconductor region and the fifth semiconductor region are contact with each other.

3. The device according to claim 1, wherein an interface between the fifth semiconductor region and the second insulating film has a fixed charge.

4. The device according to claim 1, wherein an impurity concentration of a portion where the fifth semiconductor region is in contact with the second insulating film is same as an impurity concentration of a portion where the third semiconductor region is in contact with the first insulating film, and
an impurity concentration of a portion where the fifth semiconductor region is in contact with the first semiconductor region is same as an impurity concentration of a portion where the third semiconductor region is in contact with the first semiconductor region.

5. The device according to claim 1, wherein, in a thermal equilibrium state, an energy barrier between the first semiconductor region and the portion where the fifth semiconductor region is in contact with the second insulating film, is lower than an energy barrier between the first semiconductor region and a portion where the fifth semiconductor region is in contact with the first semiconductor region.

6. The device according to claim 1, wherein, in a thermal equilibrium state, a difference between an energy barrier between the first semiconductor region and the portion where the fifth semiconductor region is in contact with the second insulating film, and an energy barrier between the first semiconductor region and a portion where the fifth semiconductor region is in contact with the first semiconductor region, is 0.4 V or higher.

7. The semiconductor according to claim 1, further comprising a fourth electrode between the second insulating film and the second electrode,
a potential of the fourth electrode being fixed.

8. The device according to claim 1, further comprising a fourth electrode between the second insulating film and the second electrode,
the fourth electrode being electrically connected to the second electrode.

9. The device according to claim 1, wherein, in a thermal equilibrium state, an energy barrier between the first semiconductor region and a portion where the fifth semiconductor region is in contact with the second insulating film, is 2.6 eV or less.

10. The device according to claim 1, wherein the third electrode and the second insulating film are provided respectively in plural, and a number of the third electrodes is different from a number of the second insulating films.

11. The device according to claim 1, wherein the first semiconductor region, the third semiconductor region, and the fourth semiconductor region are aligned in a direction from the first electrode toward the second electrode.

12. The device according to claim 1, wherein the first semiconductor region, the third semiconductor region, and the fourth semiconductor region are aligned in a direction intersecting a direction from the first electrode toward the second electrode.

13. The device according to claim 1, wherein a thickness of the first insulating film is same as a thickness of the second insulating film.

14. The device according to claim 1, wherein the first semiconductor region, the second semiconductor region, the third semiconductor region, the fourth semiconductor region, and the fifth semiconductor region include silicon carbide.

* * * * *